(12) United States Patent
Kim

(10) Patent No.: US 10,816,591 B2
(45) Date of Patent: Oct. 27, 2020

(54) SEMICONDUCTOR APPARATUSES AND TEST SYSTEM FOR PERFORMING BURN-IN TEST OPERATIONS AUTOMATICALLY DISTRIBUTED IN TIME IN RESPONSE TO A BURN-IN TEST COMMAND

(71) Applicant: SK hynix Inc., Icheon-si Gyeonggi-do (KR)

(72) Inventor: Jung Hyun Kim, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 168 days.

(21) Appl. No.: 16/116,461

(22) Filed: Aug. 29, 2018

(65) Prior Publication Data

US 2019/0277906 A1 Sep. 12, 2019

(30) Foreign Application Priority Data

Mar. 12, 2018 (KR) .................. 10-2018-0028474

(51) Int. Cl.
*G01R 31/26* (2020.01)
*G11C 29/56* (2006.01)
*G11C 11/408* (2006.01)
*G11C 11/4076* (2006.01)

(52) U.S. Cl.
CPC ...... *G01R 31/2642* (2013.01); *G11C 11/4076* (2013.01); *G11C 11/4085* (2013.01); *G11C 11/4087* (2013.01); *G11C 29/56012* (2013.01); *G11C 29/56016* (2013.01); *G11C 2029/5602* (2013.01)

(58) Field of Classification Search
CPC ...... G11C 29/56012; G11C 2029/4402; G11C 8/12; G11C 11/4087; G11C 29/56016; G11C 11/4076; G11C 2029/5602; G11C 11/4085; G01R 31/2642; G01R 31/2851
See application file for complete search history.

(56) References Cited

U.S. PATENT DOCUMENTS

| | | | | |
|---|---|---|---|---|
| 4,961,053 A * | 10/1990 | Krug | .................. | G01R 31/3185 257/148 |
| 5,047,711 A * | 9/1991 | Smith | ................. | G01R 31/2856 257/620 |
| 6,452,411 B1 * | 9/2002 | Miller | .............. | G01R 31/31905 324/754.07 |
| 7,106,083 B2 * | 9/2006 | Zhou | .................. | G01R 31/2884 324/73.1 |
| 7,138,283 B2 | 11/2006 | Matsushita et al. | | |

(Continued)

*Primary Examiner* — Vinh P Nguyen
(74) *Attorney, Agent, or Firm* — William Park & Associates Ltd.

(57) ABSTRACT

A semiconductor apparatus in accordance with the present teachings may include an identification information register configured to store identification information for identifying a semiconductor apparatus. The semiconductor apparatus may further include an identification information decoder configured to decode the identification information and output a decoding result as a select signal. The semiconductor apparatus may also include a word line enable control circuit configured to generate a word line control signal for enabling or disabling all word lines of the semiconductor apparatus simultaneously at a predetermined time according to the select signal.

21 Claims, 7 Drawing Sheets

(56) References Cited

U.S. PATENT DOCUMENTS

| | | | |
|---|---|---|---|
| 7,268,570 B1* | 9/2007 | Audet | G01R 31/2855 324/750.05 |
| 2006/0174175 A1* | 8/2006 | Huott | G01R 31/31856 714/726 |

* cited by examiner

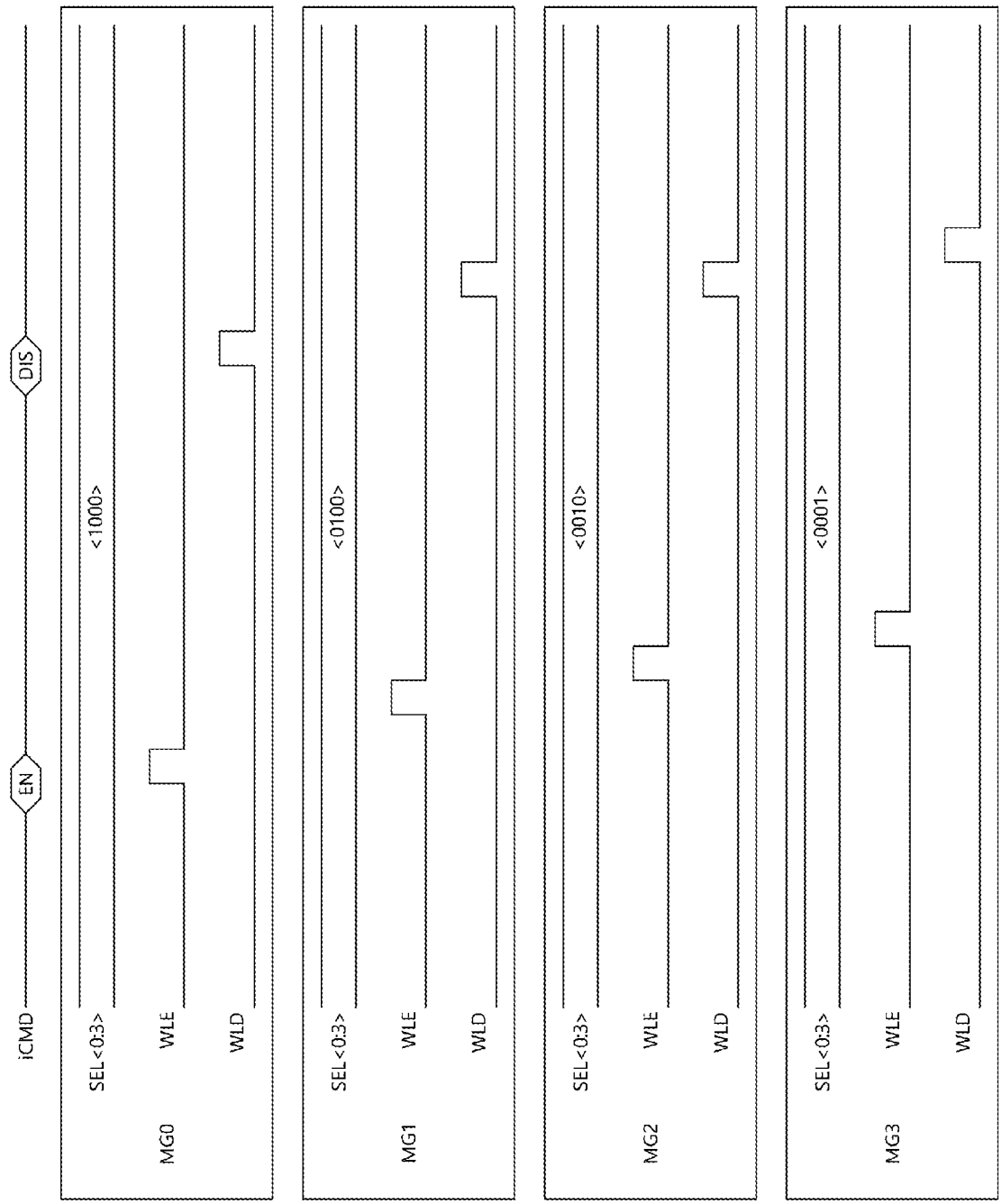

SEMICONDUCTOR APPARATUSES AND TEST SYSTEM FOR PERFORMING BURN-IN TEST OPERATIONS AUTOMATICALLY DISTRIBUTED IN TIME IN RESPONSE TO A BURN-IN TEST COMMAND

CROSS-REFERENCES TO RELATED APPLICATION

The present application claims priority under 35 U.S.C. § 119(a) to Korean application number 10-2018-0028474, filed on Mar. 12, 2018, in the Korean Intellectual Property Office, which is incorporated herein by reference in its entirety.

BACKGROUND

1. Technical Field

Various embodiments generally relate to a semiconductor circuit, and more particularly, to a semiconductor apparatus, a test system including the semiconductor apparatus, and method performed by the test system.

2. Related Art

A semiconductor apparatus such as a semiconductor memory is subjected to various tests while being fabricated as a package after a wafer-level process.

Semiconductor chips at the wafer level or packaged semiconductor chips may be mounted in test equipment and tested by the test equipment.

The various tests may include a burn-in test.

The burn-in test refers to a test of applying stress to circuit components coupled to a word line, a sense amplifier and the like of a semiconductor memory by enabling the word line and the sense amplifier for a long time and then disabling the word line and the sense amplifier, and determining whether a defect occurred due to the stress.

SUMMARY

Various embodiments are directed to a semiconductor apparatus capable of reducing a test time and reducing the maximum current amount, and a test system including the same.

A semiconductor apparatus in accordance with the present teachings may include an identification information register configured to store identification information for identifying a semiconductor apparatus. The semiconductor apparatus may further include an identification information decoder configured to decode the identification information and output a decoding result as a select signal. The semiconductor apparatus may also include a word line enable control circuit configured to generate a word line control signal for enabling or disabling all word lines of the semiconductor apparatus simultaneously at a predetermined time according to the select signal.

Another semiconductor apparatus in accordance with the present teachings may include: an identification information decoder configured to decode identification information, for identifying a semiconductor apparatus, and output a decoding result as a select signal; an operation control circuit configured to generate a word line enable period signal and an operation period signal in response to a burn-in test command; and a timing signal generation circuit configured to generate a plurality of timing signals according to the operation period signal. The semiconductor apparatus may further include: a multiplexer configured to select one of the plurality of timing signals according to the select signal and output the selected signal as a multiplexing signal; a pulse generator configured to generate a pre-operation pulse signal according to the multiplexing signal; and an operation selection circuit configured to output the pre-operation pulse signal as an enable timing signal or disable timing signal, according to the word line enable period signal. The semiconductor apparatus may also include a word line enable circuit configured to generate, in response to the enable timing signal and the disable timing signal, a word line control signal for enabling all of a plurality of word lines at the same time.

A test system in accordance with the present teachings may include: test equipment, configured to perform a burn-in test operation on at least one semiconductor apparatus; and a plurality of semiconductor apparatuses coupled with the test equipment. The test equipment may provide a burn-in test command to the plurality of semiconductor apparatuses in common. The plurality of semiconductor apparatuses, in response to the burn-in test command, may perform the burn-in test operation on a group basis according to die identification information for the plurality of semiconductor apparatuses.

A method performed by a test system for performing a burn-in test in accordance with an embodiment of the present teachings includes sending, by test equipment of the test system, a burn-in test command to a plurality of semiconductor apparatuses of the test system. The method also includes performing, in response to the burn-in test command during a time period, a burn-in test on a selected group of multiple semiconductor apparatuses from the plurality of semiconductor apparatuses, wherein all word lines for each semiconductor apparatus of the selected group are activated simultaneously during the time period.

BRIEF DESCRIPTION OF THE DRAWINGS

FIG. 9 shows a timing diagram illustrating an operation of the test system of FIG. 1, in accordance with an embodiment, in accordance with an embodiment.

DETAILED DESCRIPTION

A semiconductor apparatus and a test system including the same according to embodiments of the present disclosure are described below with reference to the accompanying drawings.

Figure 1:
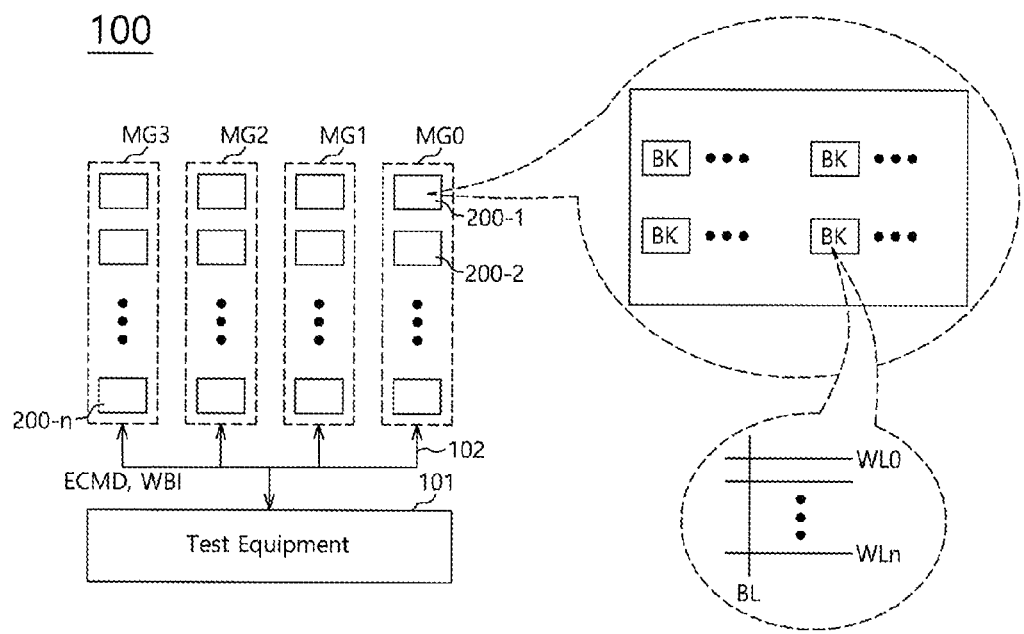
FIG. 1 shows a diagram illustrating a configuration of a test system, in accordance with an embodiment.

FIG. 1 shows a diagram illustrating the configuration of a test system 100 in accordance with an embodiment.

As illustrated in FIG. 1, the test system 100 may include test equipment 101 and a plurality of semiconductor apparatuses 200-1 to 200-n, which are coupled with the test equipment 101 and tested by the test equipment 101. For a particular embodiment, plurality of semiconductor apparatuses 200-1 to 200-n are mounded in the test equipment 101.

The plurality of semiconductor apparatuses 200-1 to 200-n may be sequentially tested through a burn-in test, for example, on a group basis.

The plurality of semiconductor apparatuses 200-1 to 200-n may be divided into a plurality of groups MG0 to MG3.

Die identification (ID) information may be used as information for identifying the plurality of semiconductor apparatuses 200-1 to 200-n. The die ID information may include a plurality of bits.

The respective pieces of die ID information of the plurality of semiconductor apparatuses 200-1 to 200-n may have different values, based on a decimal value, for example.

Of the pieces of die ID information of the semiconductor apparatuses included in at least two of the groups, the plurality of semiconductor apparatuses 200-1 to 200-n may have the same value at one or more bits (hereafter, referred to as identification information) of the plurality of bits from the most significant bit (MSB) to the least significant bit (LSB), based on a binary value.

Therefore, the plurality of semiconductor apparatuses 200-1 to 200-n may be divided into the plurality of groups MG0 to MG3 through the method of grouping the semiconductor apparatuses by identification information.

The arrangement of the plurality of groups MG0 to MG3 in FIG. 1 is only one example, chosen for convenience of description. During actual test processes, each of the groups may have a different position and a different number of semiconductor apparatuses, depending on the identification information.

Each of the semiconductor apparatuses 200-1 to 200-n may include a plurality of memory banks BK.

Each of the memory banks BK may include a plurality of word lines WL0 to WLn and a plurality of bit lines BL. Although not illustrated, each of the memory banks BK may include memory cells coupled to the plurality of word lines WL0 to WLn and to the plurality of bit lines BL and include sense amplifiers for sensing and amplifying data of the memory cells.

The test equipment 101 may provide a command ECMD and a burn-in test signal WBI to the plurality of semiconductor apparatuses 200-1 to 200-n through a communication line 102.

The test system 100, in accordance with one embodiment, inputs only one burn-in test command at the initial stage of a test, such that burn-in tests for all the semiconductor apparatuses 200-1 to 200-n can be performed with time difference without additional control from the test equipment 101.

That is, the test equipment 101 may provide the burn-in test command to the plurality of semiconductor apparatuses 200-1 to 200-n in common, and the plurality of semiconductor apparatuses 200-1 to 200-n may perform an internal control operation related to the burn-in test on a group basis at times corresponding to their die ID information, in response to the burn-in test command.

The internal control operation related to the burn-in test may include a word line enable/disable operation or a word line enable/disable operation and a sense amplifier enable/disable operation.

The test equipment 101 may provide the command ECMD to the plurality of semiconductor apparatuses 200-1 to 200-n through a part of an address in an address channel among the communication lines 102.

Unlike the command ECMD obtained by combining the addresses, the test equipment 101 may provide the burn-in test signal WBI to the plurality of semiconductor apparatuses 200-1 to 200-n at a DC level through a specific signal line.

For example, when the burn-in test signal WBI is at a high level, the burn-in test signal WBI may define a burn-in test mode.

When the word lines of all the memory banks BK of the plurality of semiconductor apparatuses 200-1 to 200-n are enabled at the same time, it is possible to reduce an amount of time needed to perform the burn-in test.

However, when the word lines of all the banks of the plurality of semiconductor apparatuses 200-1 to 200-n are enabled at the same time, a current may rapidly rise to cause an abnormal operation of the test equipment 101 or a drop in a supply voltage may occur.

Therefore, the test system 100, in accordance with an embodiment, may input only one or a limited number of burn-in test commands at the initial stage of a test, such that burn-in tests for the entire semiconductor apparatuses 200-1 to 200-n can be automatically distributed in time and be performed without additional control from the test system 100.

Figure 2:
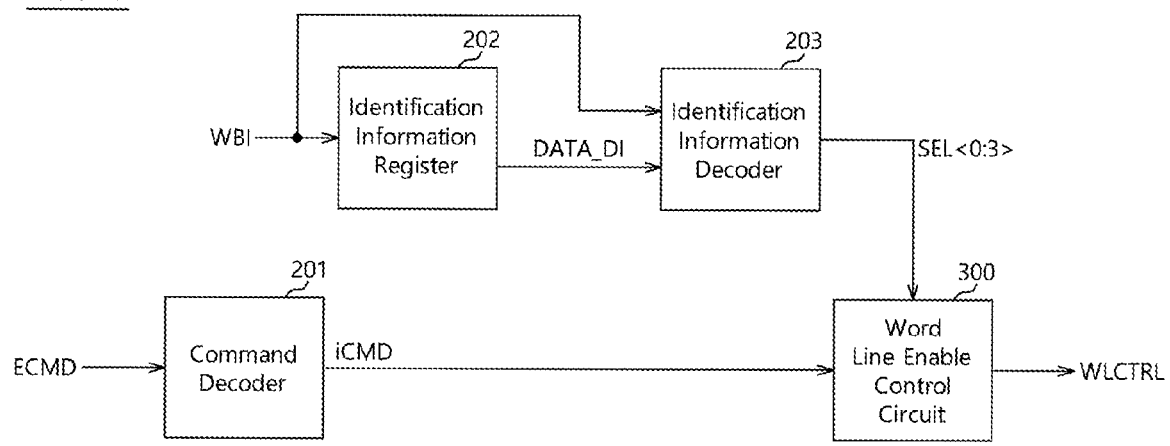
FIG. 2 shows a diagram illustrating a configuration of a semiconductor apparatus of FIG. 1, in accordance with an embodiment.

FIG. 2 illustrates a configuration of a semiconductor apparatus of FIG. 1.

As illustrated in FIG. 2, any one of the plurality of semiconductor apparatuses 200-1 to 200-n, as shown, for example, the semiconductor apparatus 200-1, may include a command decoder 201, an identification information register 202, an identification information decoder 203, and a word line enable control circuit 300.

The command decoder 201 may generate an internal command iCMD by decoding an external command ECMD provided by the test equipment 101.

The internal command iCMD may include commands defining word line enabling or disabling.

The identification information register 202 may store die ID information or identification information DATA_DI corresponding to at least part of the die ID information, as information for identifying the semiconductor apparatus 200-1 or each of the semiconductor apparatuses 200-1 to 200-n.

The identification information register 202 may output the identification information DATA_DI according to the burn-in test signal WBI.

The identification information register 202 may use a part of a fuse array for storing information related to various operations including a repair operation of the semiconductor apparatus 200-1, and the identification information DATA_DI stored in a part of the fuse arrays may be automatically outputted during a power-up sequence period.

The identification information register 202 may output one or more bits among the plurality of bits of the die ID information as the identification information DATA_DI, the one or more bits being previously set to divide the plurality of semiconductor apparatuses 200-1 to 200-$n$ into the plurality of groups MG0 to MG3.

The identification information decoder 203 may decode the identification information DATA_DI in response to the burn-in test signal WBI, and may output the decoding result as a select signal SEL<0:3>.

The select signal SEL<0:3> may take on different values for the respective groups MG0 to MG3. Thus, the select signal SEL<0:3> may be used as a signal for controlling the burn-in tests for all the semiconductor apparatuses 200-1 to 200-$n$, such that the burn-in tests can be distributed and performed on the plurality of groups MG0 to MG3.

When the internal command iCMD is inputted to the word line enable control circuit 300, the word line enable control circuit 300 may generate a word line control signal WLCTRL for simultaneously enabling or disabling all of the word lines WL0 to WLn of the semiconductor apparatus 200-1 at a predetermined time according to the select signal SEL<0:3>. The word "predetermined" as used herein with respect to a parameter, such as a time of enablement or disablement for word lines, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 3:
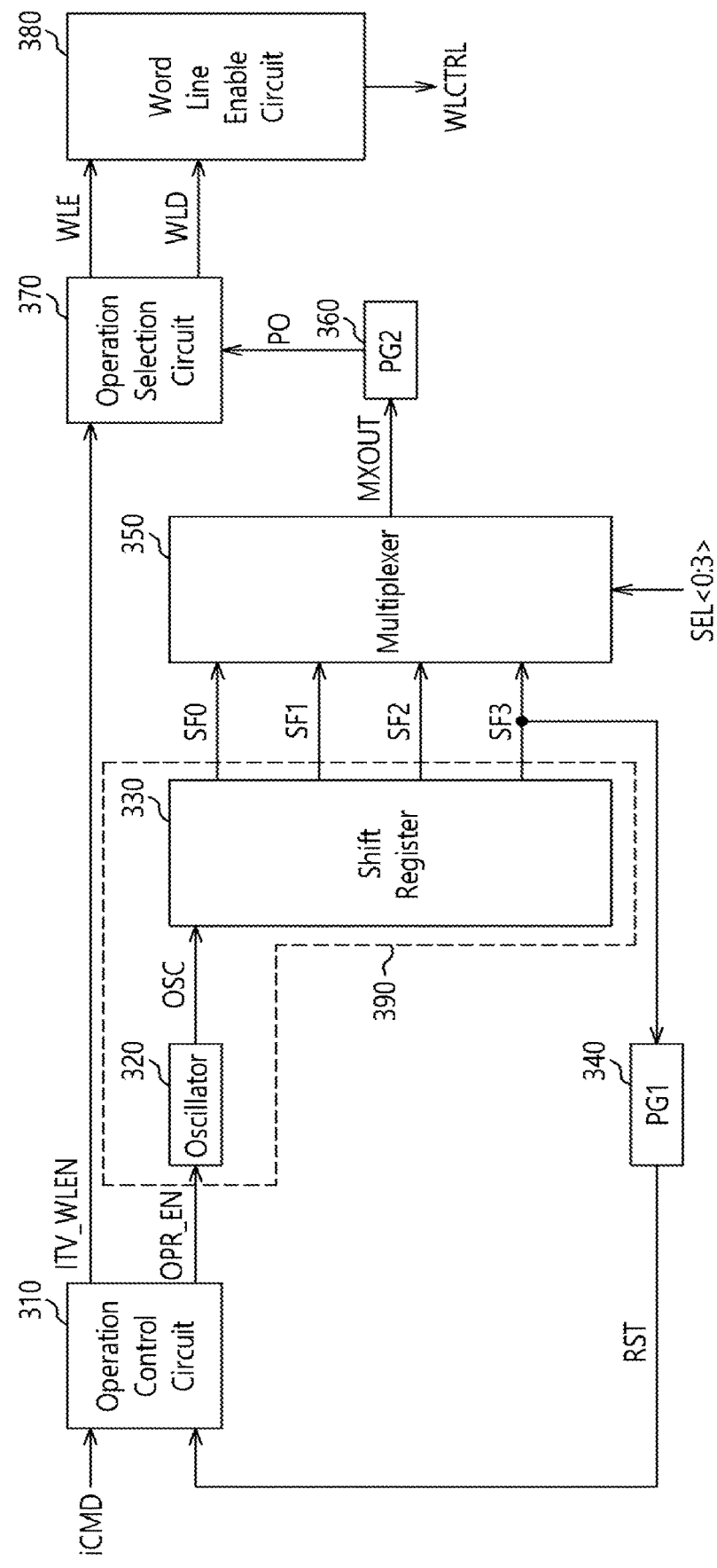
FIG. 3 shows a diagram illustrating a configuration of the word line enable control circuit of FIG. 2, in accordance with an embodiment.

FIG. 3 illustrates a configuration of a word line enable control circuit 300-1, for example, a first configuration of the word line enable control circuit 300 of FIG. 2, in accordance with an embodiment.

As illustrated in FIG. 3, the word line enable control circuit 300-1 may include an operation control circuit 310, a timing signal generation circuit 390, a first pulse generator (PG1) 340, a multiplexer 350, a second pulse generator (PG2) 360, an operation selection circuit 370, and a word line enable circuit 380.

The operation control circuit 310 may generate a word line enable period signal ITV_WLEN and an operation period signal OPR_EN, in response to the internal command iCMD and a reset signal RST.

The timing signal generation circuit 390 may generate a plurality of timing signals according to the operation period signal OPR_EN.

The timing signal generation circuit 390 may include an oscillator 320 and a shift register 330.

The oscillator 320 may generate an oscillation signal OSC during an active period of the operation period signal OPR_EN.

The shift register 330 may generate timing signals, i.e. shift signals SF0 to SF3 in response to the oscillation signal OSC.

The first pulse generator 340 may generate the reset signal RST according to the shift signal SF3 of the shift signals SF0 to SF3.

The multiplexer 350 may select one of the shift signals SF0 to SF3 according to the select signal SEL<0:3> and may output the selected signal as a multiplexing signal MXOUT.

The second pulse generator 360 may generate a pre-operation pulse signal PO according to the multiplexing signal MXOUT.

The operation selection circuit 370 may output the pre-operation pulse signal PO as an enable timing signal WLE or disable timing signal WLD, according to the word line enable period signal ITV_WLEN.

The word line enable circuit 380 may generate the word line control signal WLCTRL for enabling all of the word lines WL0 to WLn at the same time in response to the enable timing signal WLE and the disable timing signal WLD.

The word line control signal WLCTRL may include a row active signal and a signal for controlling a row address decoder (not illustrated) of the semiconductor apparatus 200-1 to select all of the word lines WL0 to WLn regardless of a row address.

Figure 4:
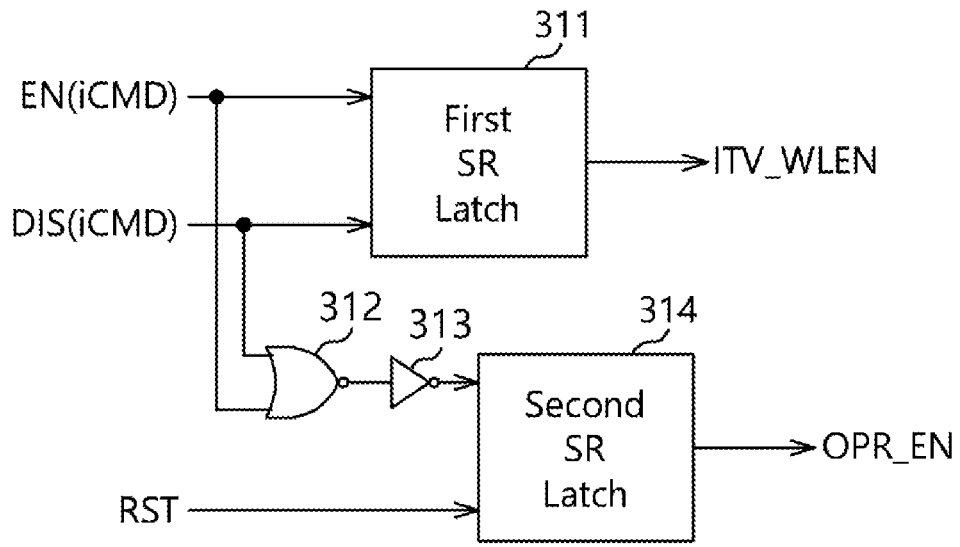
FIG. 4 shows a diagram illustrating a configuration of the operation control circuit of FIG. 3, in accordance with an embodiment.

FIG. 4 illustrates a configuration of the operation control circuit 310 of FIG. 3.

As illustrated in FIG. 4, the operation control circuit 310 may include a first SR latch 311, logic gates 312 and 313, and a second SR latch 314.

The first SR latch 311 may generate the word line enable period signal ITV_WLEN according to an internal command iCMD:EN defining word line enabling and an internal command iCMD:DIS defining word line disabling.

The first SR latch 311 may activate the word line enable period signal ITV_WLEN according to the internal command iCMD:EN defining word line enabling, and may deactivate the word line enable period signal ITV_WLEN according to the internal command iCMD:DIS defining word line disabling.

The combined logic gates, i.e. a NOR gate 312 and an inverter 313, may perform an OR operation on the internal command EN iCMD:EN defining word line enabling and the internal command iCMD:DIS defining word ling disabling, and output the operation result.

The second SR latch 314 may generate the operation period signal OPR_EN according to an output of the inverter 313 and the reset signal RST.

The second SR latch 314 may activate the operation period signal OPR_EN according to the output of the inverter 313, and may deactivate the operation period signal OPR_EN according to the reset signal RST.

Figure 5:
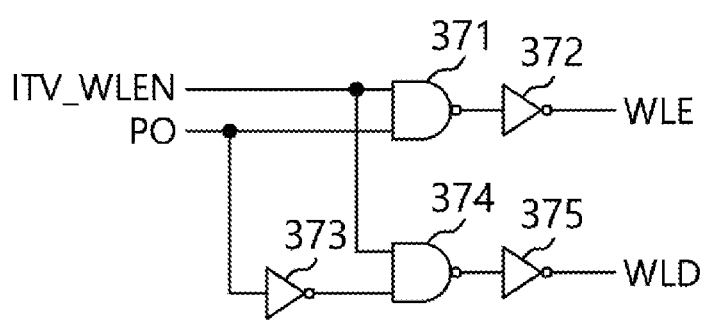
FIG. 5 shows a diagram illustrating a configuration of the operation selection circuit of FIG. 3, in accordance with an embodiment.

FIG. 5 illustrates a configuration of the operation selection circuit 370 of FIG. 3.

As illustrated in FIG. 5, the operation selection circuit 370 may include a plurality of logic gates 371 to 375.

The first NAND gate 371 and the first inverter 372 may perform an AND operation on the word line enable period signal ITV_WLEN and the pre-operation pulse signal PO, and may output the AND operation result as the enable timing signal WLE.

The second inverter 373 may invert the pre-operation pulse signal PO, and output the inverted signal.

The second NAND gate 374 and the third inverter 375 may perform an AND operation on the word line enable period signal ITV_WLEN and the output signal of the second inverter 373, and may output the AND operation result as the disable timing signal WLD.

Figure 6:
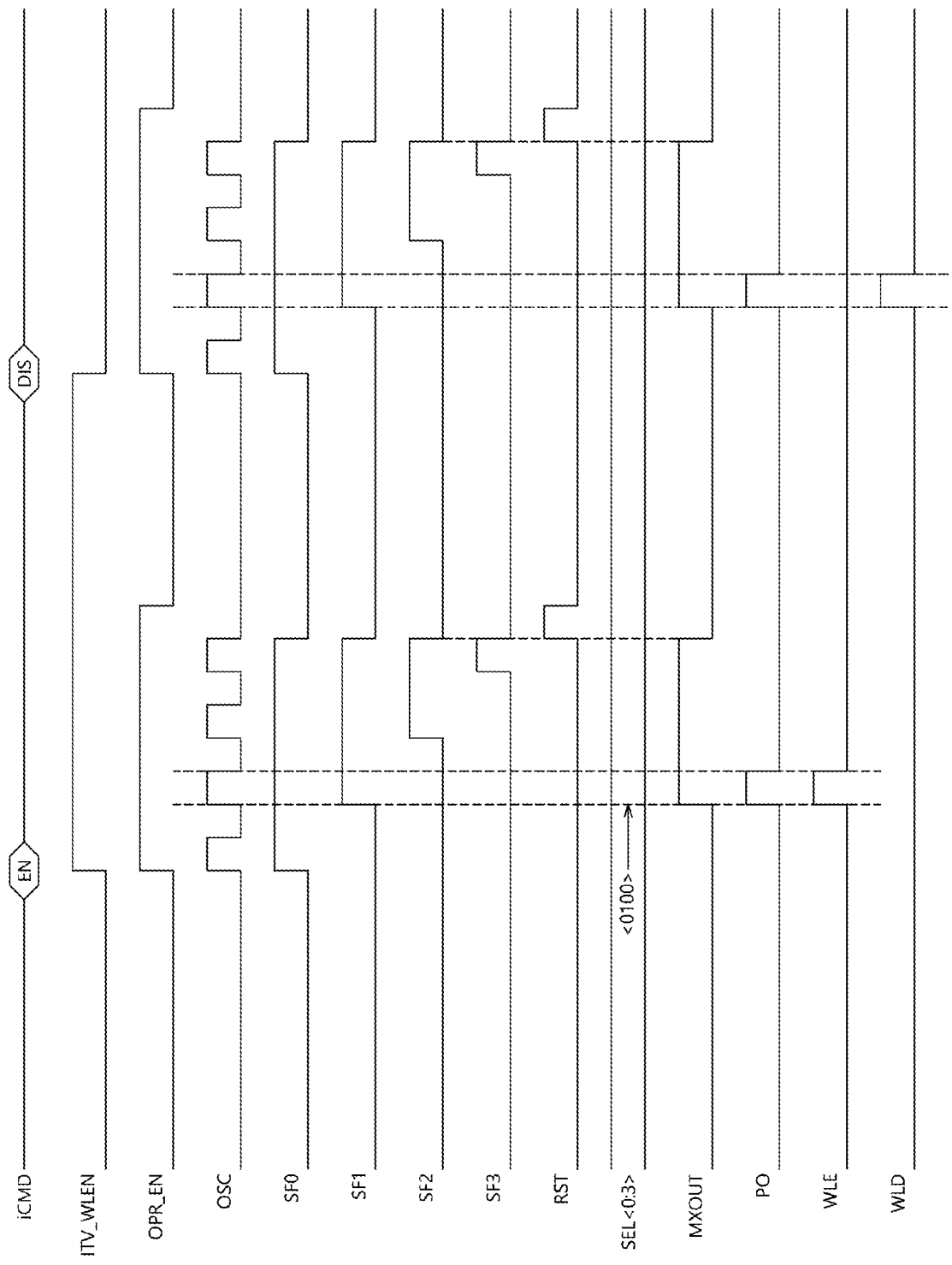
FIG. 6 shows a timing diagram illustrating an operation of the word line enable control circuit of FIG. 3.

FIG. 6 shows a timing diagram illustrating an operation of the word line enable control circuit 300-1 of FIG. 3.

Referring to FIG. 6, the operation of the word line enable control circuit 300-1 is described.

According to the internal command iCMD:EN defining word line enabling, the word line enable period signal ITV_WLEN and the operation period signal OPR_EN may be activated.

During the active period of the operation period signal OPR_EN, the oscillation signal OSC may be generated.

According to the oscillation signal OSC, the shift signals SF0 to SF3 may be sequentially activated.

When the select signal SEL<0:3> has a value of '0100,' for example, the shift signal SF1 may be activated according to a second pulse of the oscillation signal OSC corresponding to the select signal SEL<0:3>, and outputted as the multiplexing signal MXOUT.

The pre-operation pulse signal PO may be generated according to the multiplexing signal MXOUT.

Because the word line enable period signal ITV_WLEN is activated at a high level, the pre-operation pulse signal PO may be outputted as the enable timing signal WLE.

The word line enable circuit 380 may enable the word lines WL0 to WLn of all the memory banks BK at the same time, using the word line control signal WLCTRL, according to the enable timing signal WLE.

According to the shift signal SF3, the reset signal RST may be generated.

According to the reset signal RST, the operation period signal OPR_EN may be deactivated.

As the operation period signal OPR_EN is deactivated, the generation of the oscillation signal OSC may be stopped.

Then, according to the internal command iCMD:DIS defining word line disabling, the word line enable period signal ITV_WLEN may be deactivated, and the operation period signal OPR_EN may be activated.

During the active period of the operation period signal OPR_EN, the oscillation signal OSC may be generated.

According to the oscillation signal OSC, the shift signals SF0 to SF3 may be sequentially activated.

Because the select signal SEL<0:3> has a value of '0100', the shift signal SF1 may be activated according to the second pulse of the oscillation signal OSC corresponding to the select signal SEL<0:3> and outputted as the multiplexing signal MXOUT.

According to the multiplexing signal MXOUT, the pre-operation pulse signal PO may be generated.

Because the word line enable period signal ITV_WLEN is deactivated to a low level, the pre-operation pulse signal PO may be outputted as the disable timing signal WLD.

The word line enable circuit 380 may disable the word lines WL0 to WLn of all the memory banks BK at the same time, using the word line control signal WLCTRL, according to the disable timing signal WLD.

According to the shift signal SF3, the reset signal RST may be generated.

According to the reset signal RST, the operation period signal OPR_EN may be deactivated.

As the operation period signal OPR_EN is deactivated, the generation of the oscillation signal OSC may be stopped.

Figure 7:
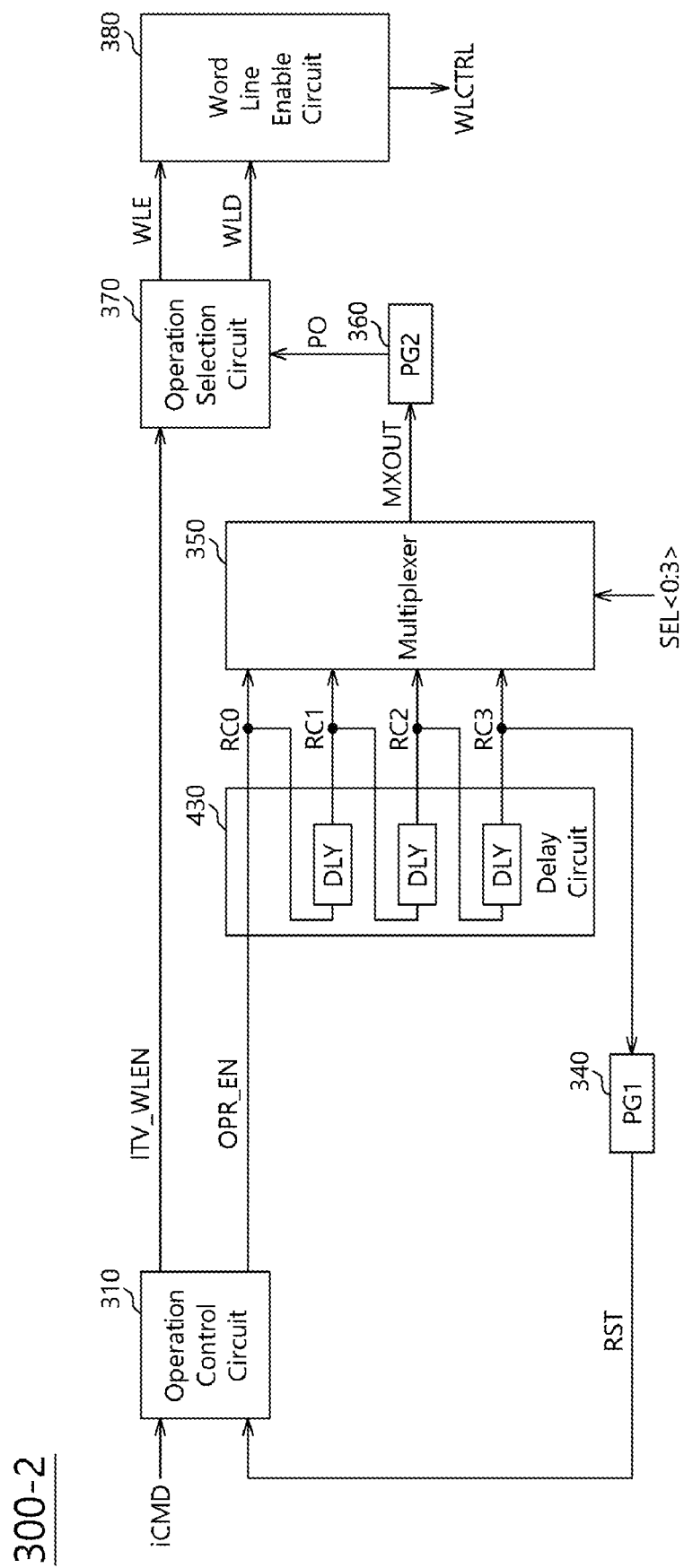
FIG. 7 shows a diagram illustrating a configuration of the word line enable control circuit of FIG. 2, in accordance with an embodiment.

FIG. 7 illustrates a configuration of a word line enable control circuit 300-2, for example, as second configuration of the word line enable control circuit 300 of FIG. 2, in accordance with an embodiment.

As illustrated in FIG. 7, the word line enable control circuit 300-2 may include an operation control circuit 310, a timing signal generation circuit 430, a first pulse generator 340, a multiplexer 350, a second pulse generator 360, an operation selection circuit 370, and a word line enable circuit 380.

For an embodiment, the operation control circuit 310, the first pulse generator 340, the multiplexer 350, the second pulse generator 360, the operation selection circuit 370, and the word line enable circuit 380 can be configured in the same manner as described for FIG. 3. Therefore, detailed descriptions of these components are not repeated here.

The timing signal generation circuit 430 may generate a plurality of timing signals according to the operation period signal OPR_EN.

The timing signal generation circuit 430 may include a delay circuit.

The delay circuit may generate timing signals, i.e. a plurality of delayed signals RC0 to RC3, by sequentially delaying the operation period signal OPR_EN using a plurality of delays DLY.

The first pulse generator 340 may generate the reset signal RST according to the delayed signal RC3 of the plurality of delayed signals RC0 to RC3.

The multiplexer 350 may select one of the delayed signals RC0 to RC3 according to the select signal SEL<0:3> and may output the selected signal as the multiplexing signal MXOUT.

Figure 8:
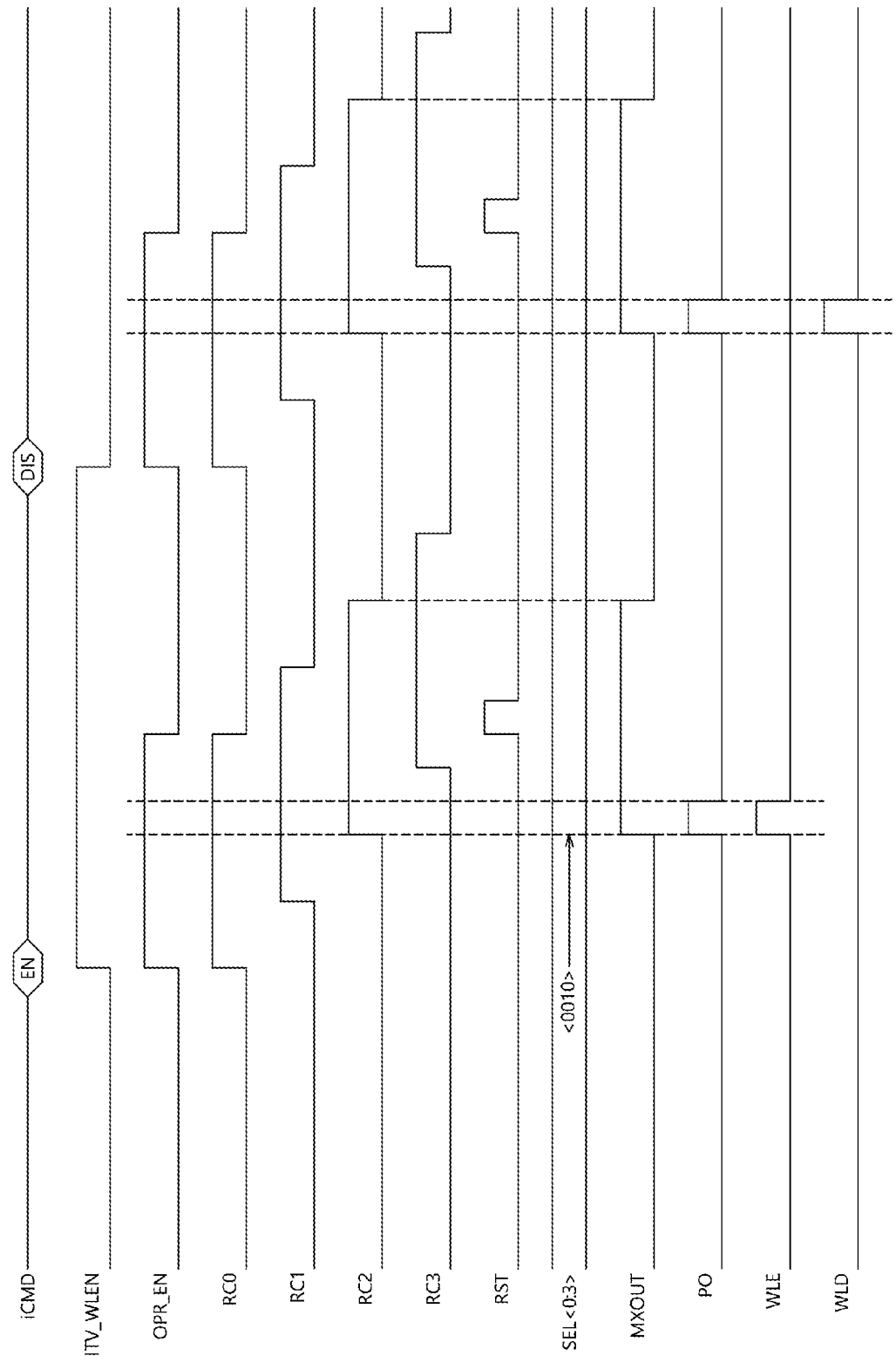
FIG. 8 shows a timing diagram illustrating an operation of the word line enable control circuit of FIG. 7, in accordance with an embodiment.

FIG. 8 shows a timing diagram illustrating an operation of the word line enable control circuit 300-2 of FIG. 7.

Referring to FIG. 8, the operation of the word line enable control circuit 300-2 is described.

According to the internal command iCMD:EN defining word line enabling, the word line enable period signal ITV_WLEN and the operation period signal OPR_EN may be activated.

According to the operation period signal ORP_EN, the plurality of delayed signals RC0 to RC3 may be sequentially activated.

When the select signal SEL<0:3> has a value of '0010,' for example, the delayed signal RC2 corresponding to the select signal SEL<0:3> may be outputted as the multiplexing signal MXOUT.

According to the multiplexing signal MXOUT, the pre-operation pulse signal PO may be generated.

Because the word line enable period signal ITV_WLEN is activated at a high level, the pre-operation pulse signal PO may be outputted as the enable timing signal WLE.

The word line enable circuit 380 may enable the word lines WL0 to WLn of all the memory banks BK at the same time, using the word line control signal WLCTRL, according to the enable timing signal WLE.

According to the delayed signal RC3, the reset signal RST may be generated.

According to the reset signal RST, the operation period signal OPR_EN may be deactivated.

Then, according to the internal command iCMD:DIS defining word line disabling, the word line enable period signal ITV_WLEN may be deactivated, and the operation period signal OPR_EN may be activated.

According to the operation period signal ORP_EN, the plurality of delayed signals RC0 to RC3 may be sequentially activated.

Because the select signal SEL<0:3> has a value of '0010', the delayed signal RC2 corresponding to the select signal SEL<0:3> may be outputted as the multiplexing signal MXOUT.

According to the multiplexing signal MXOUT, the pre-operation pulse signal PO may be generated.

Because the word line enable period signal ITV_WLEN is deactivated to a low level, the pre-operation pulse signal PO may be outputted as the disable timing signal WLD.

The word line enable circuit 380 may disable the word lines WL0 to WLn of all the memory banks BK at the same time, using the word line control signal WLCTRL, according to the disable timing signal WLD.

According to the delayed signal RC3, the reset signal RST may be generated.

According to the reset signal RST, the operation period signal OPR_EN may be deactivated.

FIG. 9 shows a timing diagram illustrating an operation of a test system, for example, the test system 100 of FIG. 1, in accordance with the embodiment.

Referring to FIG. 9, the operation of a test system, for example, the test system 101, is described in accordance with an embodiment of the present teachings.

Suppose that the values of the select signal SEL<0:3>, which are generated according to the identification information DATA_DI of the respective groups MG0 to MG3 in FIG. 1, are '1000,' '0100,' '0010,' and '0001.'

The test equipment 101 may provide the external command ECMD defining word line enabling to the plurality of semiconductor devices 200-1 to 200-n in common.

The plurality of semiconductor apparatuses 200-1 to 200-n may determine the external command ECMD, and recognize the internal command iCMD:EN defining word line enabling according to the decoding result.

The semiconductor apparatuses corresponding to the first group MG0, where the value of the select signal SEL<0:3> is set to '1000', among the plurality of groups MG0 to MG3, may perform the burn-in test-related operation, i.e. the operation of simultaneously enabling the word lines WL0 to WLn of all the memory banks BK thereof for the first time, according to the enable timing signal WLE, which is activated at an earlier timing than the semiconductor apparatuses of the other groups.

The semiconductor apparatuses corresponding to the second group MG1, where the value of the select signal SEL<0:3> is set to '0100', among the plurality of groups MG0 to MG3, may perform the burn-in test-related operation, i.e. the operation of simultaneously enabling the word lines WL0 to WLn of all the memory banks BK thereof for the second time, according to the enable timing signal WLE, which is activated for the second time after the semiconductor apparatuses corresponding to the first group MG0.

The semiconductor apparatuses corresponding to the third group MG2, where the value of the select signal SEL<0:3> is set to '0010', among the plurality of groups MG0 to MG3, may perform the burn-in test-related operation, i.e. the operation of simultaneously enabling the word lines WL0 to WLn of all the memory banks BK thereof for the third time, according to the enable timing signal WLE, which is activated for the third time after the semiconductor apparatuses corresponding to the second group MG1.

The semiconductor apparatuses corresponding to the fourth group MG3, where the value of the select signal SEL<0:3> is set to '0001', among the plurality of groups MG0 to MG3, may perform the burn-in test-related operation, i.e. the operation of simultaneously enabling the word lines WL0 to WLn of all the memory banks BK thereof for the last time, according to the enable timing signal WLE, which is activated for the last time after the semiconductor apparatuses corresponding to the third group MG2.

The test equipment 101 may provide the external command ECMD defining word line disabling to the plurality of semiconductor devices 200-1 to 200-n in common.

The plurality of semiconductor apparatuses 200-1 to 200-n may determine the external command ECMD, and thus recognize the internal command iCMD:DIS defining word line disabling according to the decoding result.

The plurality of groups MG0 to MG3 may perform the operation of simultaneously disabling the word lines WL0 to WLn of all the word lines in the same order as the word line enabling operation according to the disable timing signals WLD which are activated with time differences. That is, the first group MG0, the second group MG1, the third group MG2, and the fourth group MG3 may sequentially perform the word line disabling operation.

While various embodiments have been described above, it will be understood to those skilled in the art that the described embodiments represent a limited number of possible embodiments. Accordingly, the semiconductor apparatus and the test system including the same, which are described herein, should not be limited based on presented embodiments.

What is claimed is:

1. A semiconductor apparatus comprising:
   an identification information register configured to store identification information for identifying a semiconductor apparatus;
   an identification information decoder configured to decode the identification information and output a decoding result as a select signal; and
   a word line enable control circuit configured to generate, in response to an inputted command, a word line control signal for enabling or disabling all word lines of the semiconductor apparatus simultaneously at a predetermined time according to the select signal.

2. The semiconductor apparatus according to claim 1, wherein the identification information register outputs the identification information to the identification information decoder according to a burn-in test signal.

3. The semiconductor apparatus according to claim 1, wherein a part of a fuse array for storing operation-related information, including a repair operation of the semiconductor apparatus, is used as the identification information register, and the identification information stored in the part of the fuse array is automatically outputted during a power-up sequence period.

4. The semiconductor apparatus according to claim 1, wherein the word line enable control circuit comprises:
   an operation control circuit configured to generate a word line enable period signal and an operation period signal in response to the command;
   a timing signal generation circuit configured to generate a plurality of timing signals according to the operation period signal;
   a multiplexer configured to select one of the timing signals according to the select signal and output the selected signal as a multiplexing signal;
   a pulse generator configured to generate a pre-operation pulse signal according to the multiplexing signal;
   an operation selection circuit configured to output the pre-operation pulse signal as an enable timing signal or disable timing signal, according to the word line enable period signal; and
   a word line enable circuit configured to generate a word line control signal for enabling the plurality of word lines at the same time, in response to the enable timing signal and the disable timing signal.

5. The semiconductor apparatus according to claim 4, wherein the timing signal generation circuit comprises:
   an oscillator configured to generate an oscillation signal during an active period of the operation period signal; and
   a shift register configured to generate the plurality of timing signals in response to the oscillation signal.

6. The semiconductor apparatus according to claim 4, wherein the timing signal generation circuit comprises a delay circuit configured to generate the plurality of timing signals by sequentially delaying the operation period signal.

7. A semiconductor apparatus comprising:
   an identification information decoder configured to decode identification information, for identifying a semiconductor apparatus, and output a decoding result as a select signal;

an operation control circuit configured to generate a word line enable period signal and an operation period signal in response to a burn-in test command;

a timing signal generation circuit configured to generate a plurality of timing signals according to the operation period signal;

a multiplexer configured to select one of the plurality of timing signals according to the select signal and output the selected signal as a multiplexing signal;

a pulse generator configured to generate a pre-operation pulse signal according to the multiplexing signal;

an operation selection circuit configured to output the pre-operation pulse signal as an enable timing signal or disable timing signal, according to the word line enable period signal; and a word line enable circuit configured to generate, in response to the enable timing signal and the disable timing signal, a word line control signal for enabling all of a plurality of word lines at the same time.

8. The semiconductor apparatus of claim 7, further comprising an identification information register configured to output the identification information to the identification information decoder according to a burn-in test signal.

9. The semiconductor apparatus according to claim 7, wherein the identification information, stored in a part of a fuse array for storing operation-related information including a repair operation of the semiconductor apparatus, is automatically outputted to the identification information decoder during a power-up sequence period.

10. The semiconductor apparatus according to claim 7, wherein the timing signal generation circuit comprises:

an oscillator configured to generate an oscillation signal during an active period of the operation period signal; and a shift register configured to generate the plurality of timing signals in response to the oscillation signal.

11. The semiconductor apparatus according to claim 7, wherein the timing signal generation circuit comprises a delay circuit configured to generate the plurality of timing signals by sequentially delaying the operation period signal.

12. A test system comprising:

test equipment; and a plurality of semiconductor apparatuses divided into a plurality of groups, wherein the plurality of semiconductor apparatuses are coupled with the test equipment, wherein the test equipment provides a burn-in test command to the plurality of semiconductor apparatuses in common, and wherein the plurality of semiconductor apparatuses, in response to the burn-in test command, perform burn-in test operations automatically distributed in time on a group-by-group basis according to die identification information identifying semiconductor apparatuses of the plurality of semiconductor apparatuses in respective groups of the plurality of groups.

13. The test system according to claim 12, wherein at least part of the die identification information is used to identify semiconductor apparatuses, and wherein each of the groups includes at least one semiconductor apparatus having the same identification information.

14. The test system according to claim 13, wherein at least two of the groups have a different position and at least two of the groups have a different number of semiconductor apparatuses according to the identification information.

15. The test system according to claim 12, wherein the test equipment provides only one burn-in test command to the plurality of semiconductor apparatuses in common.

16. The test system according to claim 12, wherein the burn-in test operation comprises an operation of simultaneously enabling all word lines of all semiconductor apparatuses belonging to a group.

17. The test system according to claim 12, wherein each semiconductor apparatus of the plurality of semiconductor apparatuses comprises:

an identification information decoder configured to decode the die identification information, and output a decoding result as a select signal;

an operation control circuit configured to generate a word line enable period signal and an operation period signal in response to the burn-in test command;

a timing signal generation circuit configured to generate a plurality of timing signals according to the operation period signal;

a multiplexer configured to select one of the plurality of timing signals according to the select signal and configured to output the selected signal as a multiplexing signal;

a pulse generator configured to generate a pre-operation pulse signal according to the multiplexing signal;

an operation selection circuit configured to output the pre-operation pulse signal as an enable timing signal or a disable timing signal, according to the word line enable period signal; and a word line enable circuit configured to generate a word line control signal for simultaneously enabling the plurality of word lines in response to at least one of the enable timing signal and the disable timing signal.

18. The test system according to claim 17 further comprising an identification information register configured to output the die identification information to the identification information decoder according to a burn-in test signal.

19. The test system according to claim 17, wherein the identification information, stored in a part of a fuse array for storing operation-related information including a repair operation of the semiconductor apparatus, is automatically outputted to the identification information decoder during a power-up sequence period.

20. The test system according to claim 17, wherein the timing signal generation circuit comprises:

an oscillator configured to generate an oscillation signal during an active period of the operation period signal; and a shift register configured to generate the plurality of timing signals in response to the oscillation signal.

21. The test system according to claim 17, wherein the timing signal generation circuit comprises a delay circuit configured to generate the plurality of timing signals by sequentially delaying the operation period signal.

* * * * *